(12) United States Patent
Lee et al.

(10) Patent No.: US 8,076,733 B2
(45) Date of Patent: Dec. 13, 2011

(54) FLAT PANEL DISPLAY DEVICE HAVING AN ORGANIC THIN FILM TRANSISTOR AND METHOD OF MANUFACTURING THE SAME

(75) Inventors: Hun-Jung Lee, Suwon-si (KR); Sung-Jin Kim, Suwon-si (KR); Jong-Han Jeong, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 653 days.

(21) Appl. No.: 11/526,945

(22) Filed: Sep. 25, 2006

(65) Prior Publication Data
US 2007/0069206 A1   Mar. 29, 2007

(30) Foreign Application Priority Data
Sep. 26, 2005   (KR) .................. 10-2005-0089490

(51) Int. Cl.
*H01L 27/088* (2006.01)

(52) U.S. Cl. ......... 257/401; 257/E29.147; 257/E51.005; 349/40; 438/149; 438/281

(58) Field of Classification Search ............ 257/40, 257/59, 72, 88, 89, 258, 291, 390, 401, 443, 257/503, E29.021, E29.027, E29.117, E29.147, 257/E29.151, E29.122, E29.202, E51.005; 349/40, 43; 438/149, 281
See application file for complete search history.

(56) References Cited

U.S. PATENT DOCUMENTS

| | | | |
|---|---|---|---|
| 6,534,788 B1 * | 3/2003 | Yeo et al. ........................ | 257/72 |
| 6,992,324 B2 * | 1/2006 | Nagayama ...................... | 257/40 |
| 2003/0054586 A1 * | 3/2003 | Shtein et al. .................... | 438/99 |
| 2003/0096463 A1 * | 5/2003 | Nishio ........................... | 438/154 |
| 2004/0012017 A1 * | 1/2004 | Nagayama ...................... | 257/40 |
| 2004/0065929 A1 * | 4/2004 | Koo et al. ...................... | 257/410 |
| 2004/0161864 A1 * | 8/2004 | Kido .............................. | 438/1 |
| 2004/0169812 A1 * | 9/2004 | Kim ............................... | 349/187 |
| 2004/0238888 A1 * | 12/2004 | Yasuda et al. ................. | 257/347 |
| 2005/0140840 A1 * | 6/2005 | Hirakata et al. ................ | 349/43 |
| 2006/0082284 A1 * | 4/2006 | Shibusawa ..................... | 313/500 |

FOREIGN PATENT DOCUMENTS

| | | |
|---|---|---|
| KR | 10-2004-0013969 | 2/2004 |
| WO | WO 01/24290 A1 | 4/2001 |

* cited by examiner

*Primary Examiner* — William D Coleman
*Assistant Examiner* — Su Kim
(74) *Attorney, Agent, or Firm* — Knobbe Martens Olson & Bear LLP

(57) ABSTRACT

Provided are an organic TFT that reduces contact resistance between a source and drain electrode and an organic semiconductor layer and that can be easily manufactured, a flat panel display device having the organic TFT, and methods of manufacturing the organic TFT and the flat panel display device having the same. The organic TFT includes; a substrate; a gate electrode and a blocking layer formed on the substrate; a gate insulating film covering the gate electrode and the blocking layer; a source electrode and a drain electrode located on the gate insulating film; an auxiliary source electrode and an auxiliary drain electrode respectively located on the source electrode and the drain electrode; and an organic semiconductor layer contacting the auxiliary source electrode and the auxiliary drain electrode.

7 Claims, 8 Drawing Sheets

FLAT PANEL DISPLAY DEVICE HAVING AN ORGANIC THIN FILM TRANSISTOR AND METHOD OF MANUFACTURING THE SAME

CROSS-REFERENCE TO RELATED APPLICATIONS

This application claims the benefit of Korean Patent Application No. 10-2005-0089490, filed on Sep. 26, 2005, in the Korean Intellectual Property Office, the disclosure of which is incorporated herein in its entirety by reference.

BACKGROUND OF THE INVENTION

1. Field of the Invention

The present invention relates to an organic thin film transistor (TFT) and a flat panel display having the same, and more particularly, to an organic TFT that has a reduced contact resistance between source/drain electrodes and an organic semiconductor layer and a flat panel display having the same, and methods of manufacturing the organic thin film transistor and flat panel display device.

2. Description of the Related Technology

A conventional silicon thin film transistor (TFT) has a semiconductor layer. The semiconductor layer includes source and drain regions doped with a high concentration of dopant and a channel region formed between the source region and the drain region. The TFT also includes a gate electrode disposed on a region overlapping with the channel region. The gate electrode is insulated from the semiconductor layer. The TFT further includes a source electrode and a drain electrode respectively connected to the source region and the drain region.

However, conventional silicon TFTs have high manufacturing costs, and are easily breakable by an external impact. In addition, the TFTs cannot use a plastic substrate since the silicon TFT is produced at a temperature greater than about 300° C. The TFTs may be used either as a switching device or as a driving device for each of the pixels in flat panel display devices, such as a liquid crystal displays (LCD) and electroluminescence displays (ELD).

To provide flexible panel display devices having a large screen size and a thin thickness, attempts have been made to use plastic materials for forming a substrate instead of a conventional glass material. However, a low temperature process must be employed to process the plastic materials. Therefore, conventional silicon TFTs, which are processed at a high temperature, cannot employ plastic substrates.

On the other hand, this problem can be solved when an organic film is used as a semiconductor layer of a TFT. Therefore, studies about organic TFTs that use an organic film as a semiconductor layer have been actively performed. For example, poly-acetylene is a conjugated organic polymer that has semiconductor characteristics. It can be synthesized in various ways at a low cost, and can be easily molded in a fabric or film shape. Poly-acetylene also has flexibility and conductivity required for use in organic material-based transistors.

However, there is high contact resistance between source and drain electrodes and the organic film when an organic TFT is used as a semiconductor layer. That is, a high concentration of dopant cannot be implanted in the organic semiconductor layer included in the organic TFT unlike the silicon semiconductor layer included in the conventional silicon TFT. Accordingly, an ohmic contact cannot be formed between the source and drain electrodes and the organic semiconductor layer due to high resistance therebetween.

SUMMARY OF CERTAIN INVENTIVE ASPECTS

One aspect of the invention provides a method of manufacturing an organic TFT. The method comprises: forming a gate electrode over a substrate; forming a gate insulating film over the substrate and over the gate electrode; forming a source electrode and a drain electrode over the gate insulating film such that the source and drain electrodes have a gap therebetween, the gap exposing a portion of the gate insulating film; forming a photoresist layer over the source electrode, the drain electrode, and the gate insulating film; illuminating light to the photoresist layer such the light passes through the substrate before reaching the photoresist layer; selectively removing at least a portion of the photoresist layer, thereby exposing at least a portion of the source electrode and at least a portion of the drain electrode; forming a metal layer over the source electrode, the drain electrode, and the photoresist layer; removing the photoresist layer; and forming an organic semiconductor layer so as to contact at least a portion of the metal layer on the source electrode and the drain electrode.

The gate electrode may comprise an opaque material, and the source electrode and the drain electrode may comprise a transparent material. The photoresist layer may comprise a positive photoresist. The method may further comprise forming a blocking layer on the same layer as the gate electrode before forming the gate insulating film, wherein forming the gate insulating film comprises forming the gate insulating film covering the gate electrode and the blocking layer. The blocking layer may have openings underlying the source electrode and the drain electrode. The gate electrode and the blocking layer may be simultaneously formed.

The gate electrode and the blocking layer may comprise an opaque material, and the source electrode and the drain electrode may comprise a transparent material. The photoresist layer may comprise a positive photoresist. The gate electrode may comprise a transparent material, and the source electrode and drain electrode may comprise an opaque material. The photoresist layer may comprise a negative photoresist. The metal layer may comprise a noble metal. The noble metal may comprise Au.

Another aspect of the invention provides an organic TFT comprising: a substrate; a gate electrode and a blocking layer formed over the substrate; a gate insulating film over the gate electrode and the blocking layer; a source electrode and a drain electrode formed over the gate insulating film; an auxiliary source electrode and an auxiliary drain electrode formed on the source electrode and the drain electrode, respectively; and an organic semiconductor layer contacting the auxiliary source electrode and the auxiliary drain electrode.

The blocking layer may have openings underlying the source electrode and the drain electrode. The blocking layer may comprise the same material as that of the gate electrode. The gate electrode and the blocking layer may comprise an opaque material. The auxiliary source electrode and the auxiliary drain electrode may comprise a noble metal.

Another aspect of the invention provides a flat panel display device comprising the organic TFT described above. The flat panel display device may further comprise an organic light emitting element electrically connected to the organic TFT.

Yet another aspect of the invention provides a method of manufacturing a flat panel display device. The method comprises: forming a gate electrode over a substrate; forming a gate insulating film over the substrate and the gate electrode; forming a source electrode and a drain electrode over the gate insulating film such that the source and drain electrodes have a gap therebetween, the gap exposing a portion of the gate insulating film overlying the gate electrode; forming a photoresist layer over the source electrode, the drain electrode, and the gate insulating film; illuminating light to the photoresist layer such the light passes through the substrate before reaching the photoresist layer; selectively removing at least a portion of the photoresist layer, thereby exposing at least a portion of the source electrode and at least a portion of the drain electrode; forming a metal layer covering the source electrode, the drain electrode, and the photoresist layer; removing the photoresist layer; forming an organic semiconductor layer so as to contact at least a portion of the metal layer on the source electrode and the drain electrode; and forming a display element electrically connected to one of the source electrode and the drain electrode.

The gate electrode may comprise an opaque material, and the source electrode and the drain electrode may comprise a transparent material. The metal layer may comprise a noble metal. The noble metal may comprise Au.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF CERTAIN INVENTIVE EMBODIMENTS

The invention will now be described more fully with reference to the accompanying drawings in which exemplary embodiments of the invention are shown.

Figure 1:
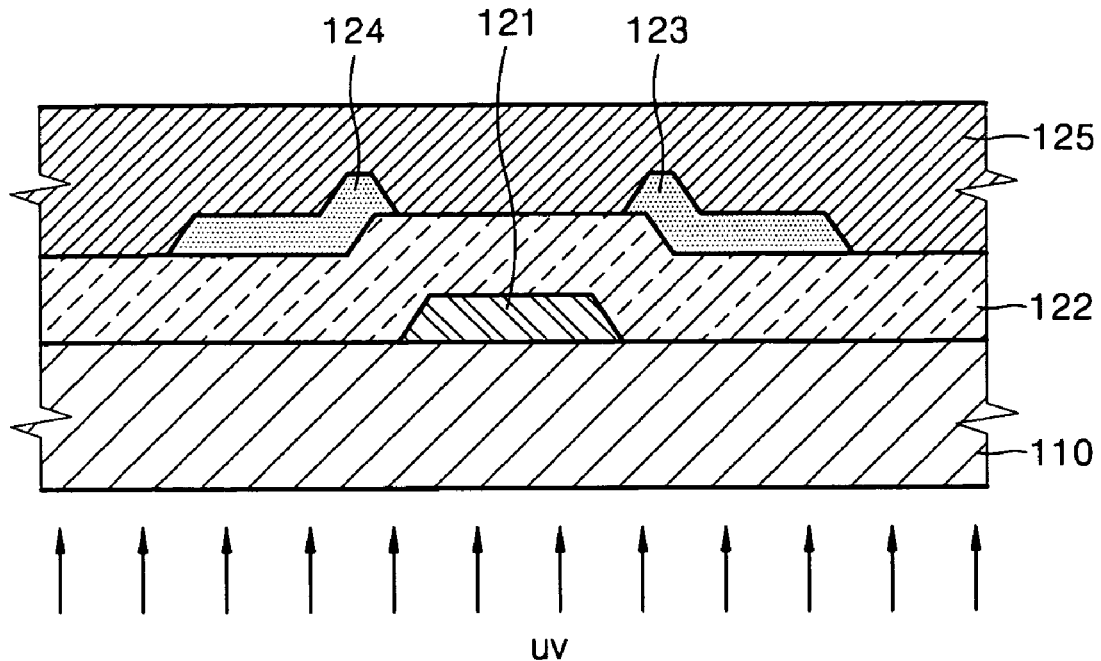
FIGS. 1 through 5 are cross-sectional views illustrating a method of manufacturing an organic TFT according to an embodiment.

FIGS. 1 through 5 are cross-sectional views illustrating a method of manufacturing an organic TFT according to an embodiment. Referring to FIG. 1, a gate electrode 121 is formed on a substrate 110. A gate insulating film 122 is formed to cover the gate electrode 121. A source electrode 123 and a drain electrode 124 are formed on the gate insulating film 122. A photoresist layer 125 covering the source electrode 123 and the drain electrode 124 is formed.

The substrate 110 may include a transparent glass substrate or a plastic material substrate, such as acryl. The substrate 110 may be formed of a transparent material since there is a process for exposing the photoresist layer 125 through the substrate 110, which will be described later in detail.

The gate electrode 121 may include an opaque conductive material, such as Mg, Al, Ni, Cr, Mo, or W, or a compound of these metals. The gate insulating film 122 may be formed of a transparent material. The source and drain electrodes 123 and 124 may also be formed of a transparent material such as ITO, IZO, or ZnO. In the illustrated embodiment, the photoresist layer 125 is a positive photoresist.

Figure 2:
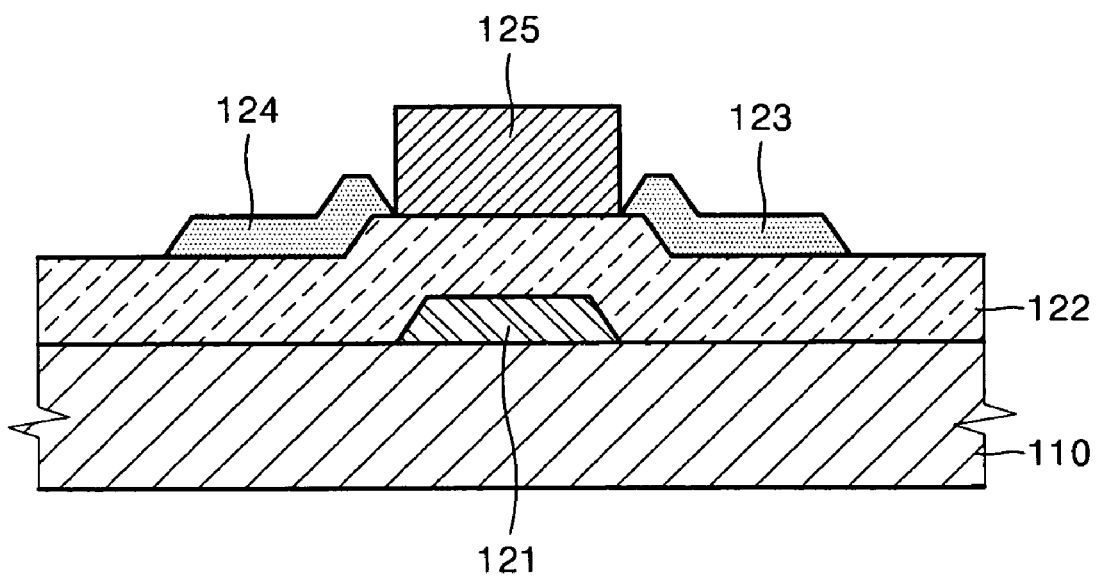

After the photoresist layer 125 is formed, the photoresist layer 125 is exposed to ultraviolet (UV) rays irradiated from below through the substrate 110. At this time, the photoresist layer 125 is exposed to the UV rays except for a portion of the photoresist layer 125 above the gate electrode 121. The gate electrode 121 is formed of an opaque material, and blocks the UV rays from reaching the portion of the photoresist layer 125. On the other hand, the gate insulating film 122, the source electrode 123, and the drain electrode 124 are formed of transparent materials, and allow the UV rays to reach the photoresist layer 125. As described above, the photoresist layer 125 is a positive photoresist, and as depicted in FIG. 2, the photoresist layer 125 above the gate electrode 121 remains when a developing process is performed after the exposure process.

Figure 3:
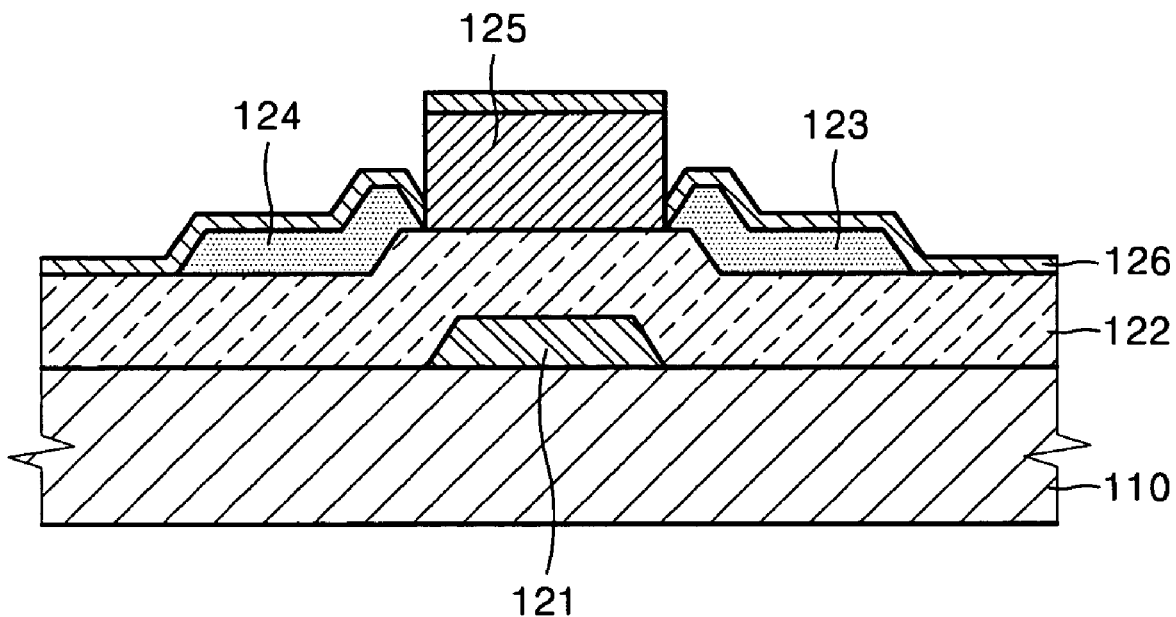

As depicted in FIG. 3, after the photoresist layer 125 has been developed, a metal layer 126 covering the source electrode 123, the drain electrode 124, and the remainder of the photoresist layer 125 is formed. The metal layer 126 is formed of a noble metal, such as Au, Ag, Pt, Ta, or Pd.

Figure 4:
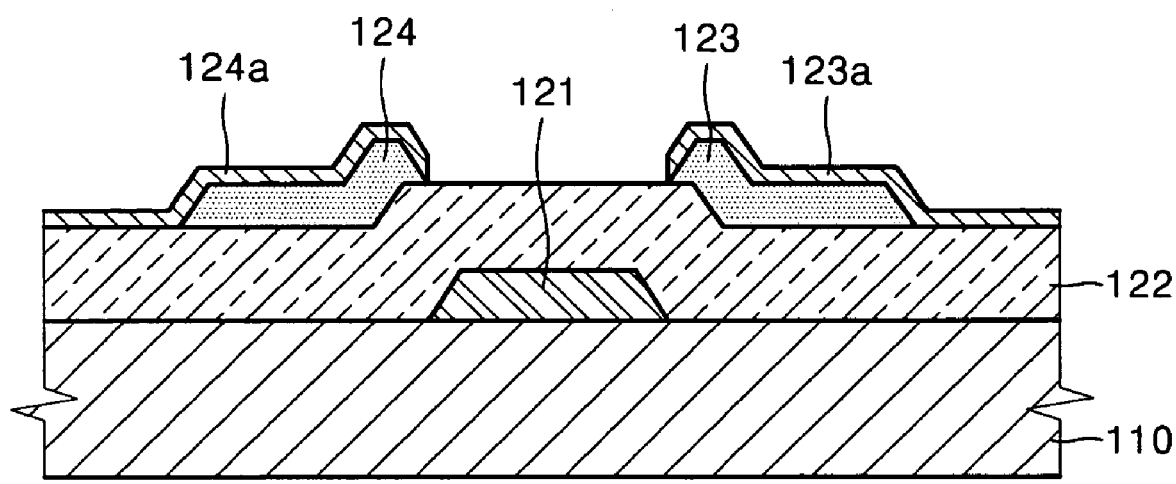

After the metal layer 126 is formed, the remainder of the photoresist layer 125 is removed. When the remainder of the photoresist layer 125 is removed, as depicted in FIG. 4, the metal layer 126 does not exist on the portion of the gate insulating film 122 over the gate electrode 121. The metal layer 126 is only formed on the source electrode 123 and the drain electrode 124. The metal layer on the source electrode 123 can be used as an auxiliary source electrode 123a and the metal layer on the drain electrode 124 can be used as an auxiliary drain electrode 124a.

Figure 5:
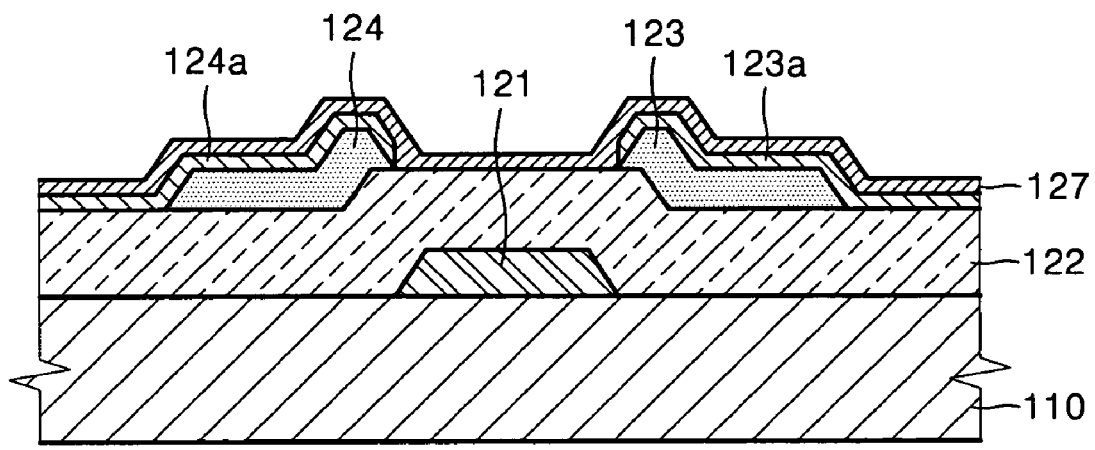

Subsequently, as depicted in FIG. 5, an organic semiconductor layer 127 contacting the auxiliary source electrode 123a and the auxiliary drain electrode 124a is formed on the metal layer formed on the source electrode 123, and the drain electrode 124. The organic semiconductor layer 127 can be formed using any suitable method, for example, an inkjet printing method, a dipping method, or a spin coating method.

The organic semiconductor layer 127 is formed of an organic material having a semiconductor characteristic, for example, a material that includes at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyplorene and its derivatives, polythiopenevinylene and its derivatives, polythiophene-hetero ring aromatic copolymer and its derivatives, alpha-5-thiophene oligothiophene and its derivatives, phthalocianin that does not include a metal and its derivatives, phyromeliticdianhydride and its derivatives, phyromelitic diimid and its derivatives, perrylenetetracarboxy acid dianhydride and its derivatives, and perrylenetetracarboxylic diimid and its derivatives.

A large potential barrier generally exists between a conductive material such as Mg, Al, Ni, Cr, Mo, W, etc. and an organic semiconductor layer. Thus, signals cannot be transmitted between a source electrode and a drain electrode due to the potential barrier even if a channel is formed in the organic semiconductor layer by applying a predetermined electrical signal to a gate electrode. This is called contact resistance. However, in the case of a noble metal such as Au, the contact resistance is not a problem because the potential barrier is relatively small between the noble metal and the organic semiconductor layer. Accordingly, in the method of manufacturing an organic TFT according to the embodiment, the contact resistance problem between the source/drain electrodes and the organic semiconductor layer can be solved by the auxiliary source electrode 123a and the auxiliary drain electrode 124a of a noble metal such as Au.

FIGS. 6 through 9 are cross-sectional views illustrating a method of manufacturing an organic TFT according to another embodiment. In the method of manufacturing an organic TFT illustrated in FIGS. 1 through 5, the gate electrode 121 is formed of an opaque material and the source electrode 123 and the drain electrode 124 are formed of a transparent material. In addition, a positive photoresist layer 125 is used. However, in the embodiment shown in FIGS. 6-9, a gate electrode 221 is formed of a transparent material and a source electrode 223 and a drain electrode 224 are formed of an opaque material. In addition, a negative photoresist layer 225 is used.

Figure 6:
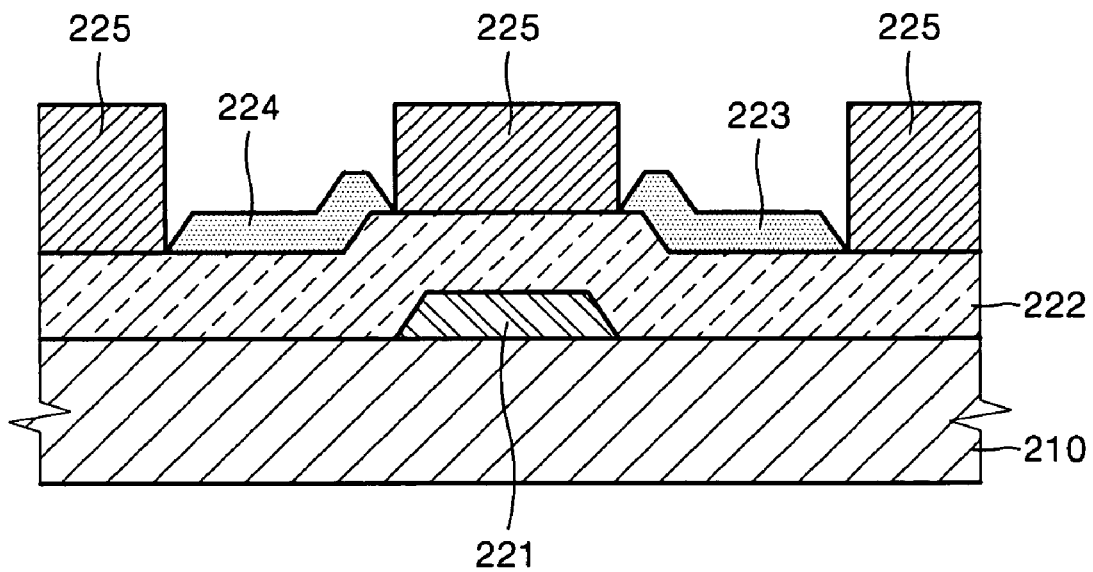
FIGS. 6 through 9 are cross-sectional views illustrating a method of manufacturing an organic TFT according to another embodiment.
Figure 7:
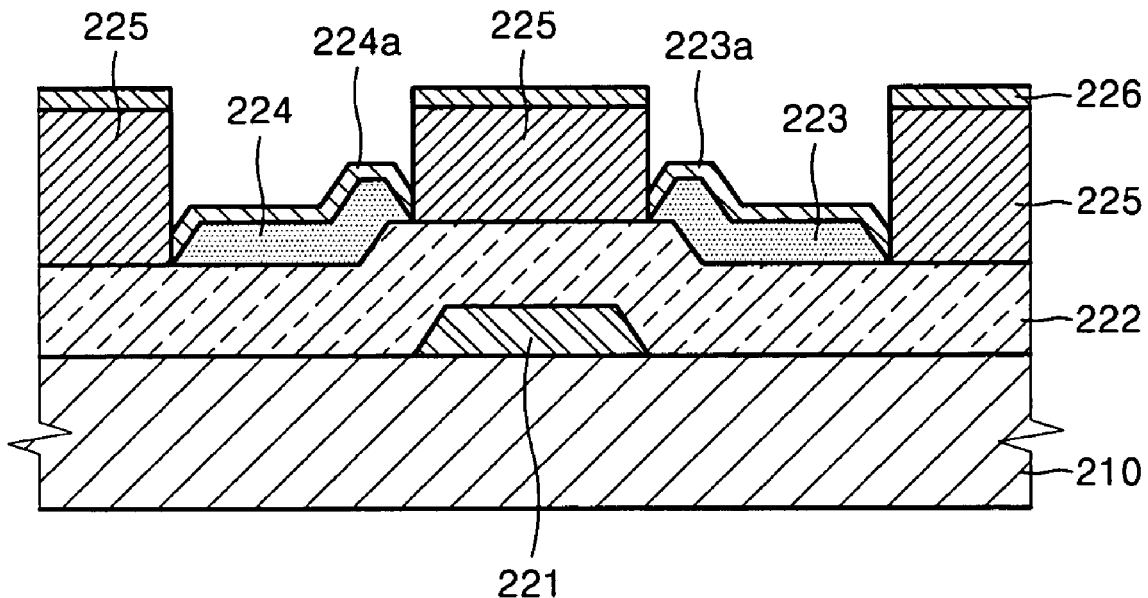
Figure 8:
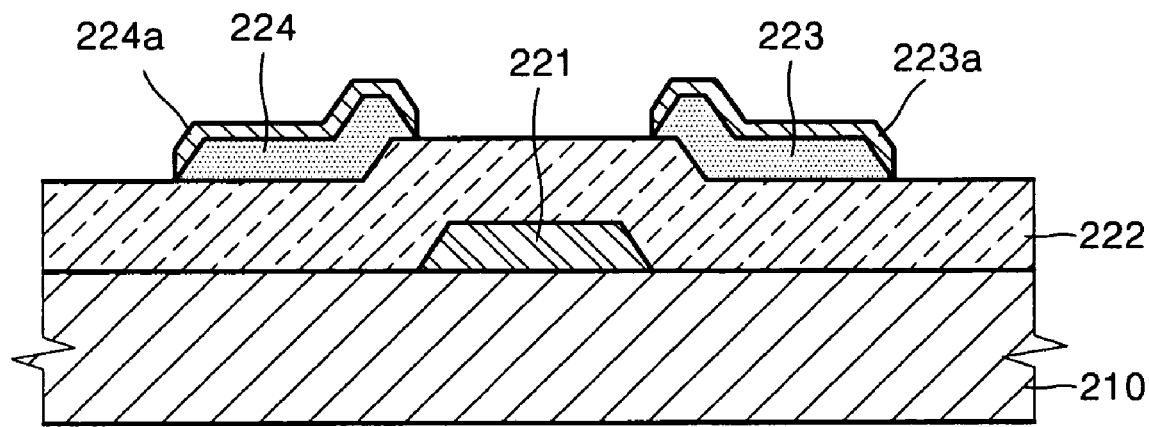
Figure 9:
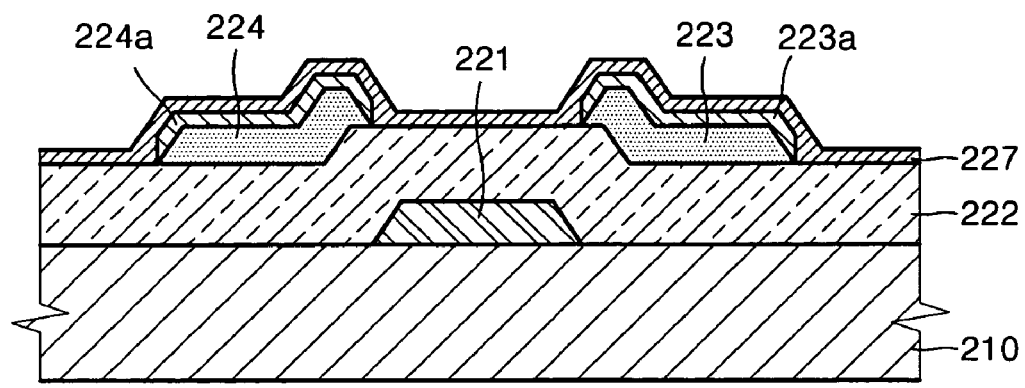

In the illustrated embodiment, when the negative photoresist layer 225 is exposed through a substrate 210, as depicted in FIG. 6, the negative photoresist layer 225 on the source electrode 223 and the drain electrode 224 is removed. As depicted in FIG. 7, a metal layer 226 is formed using a noble metal on the source electrode 223, the drain electrode 224, and the negative photoresist layer 225. As depicted in FIG. 8, when the remainder of the negative photoresist layer 225 is removed, the metal layer 226 formed of a noble metal remains only on the source electrode 223 and the drain electrode 224. Accordingly, the metal layer remaining on the source electrode 123 forms an auxiliary source electrode 223a and the metal layer remaining on the drain electrode 224 forms an auxiliary drain electrode 224a. Subsequently, as depicted in FIG. 9, an organic semiconductor layer 227 is formed on the resulting structure. The auxiliary source electrode 223a and the auxiliary drain electrode 224a reduce contact resistance between the source and drain electrodes 223 and 224 and the organic semiconductor layer 227.

Figure 10:
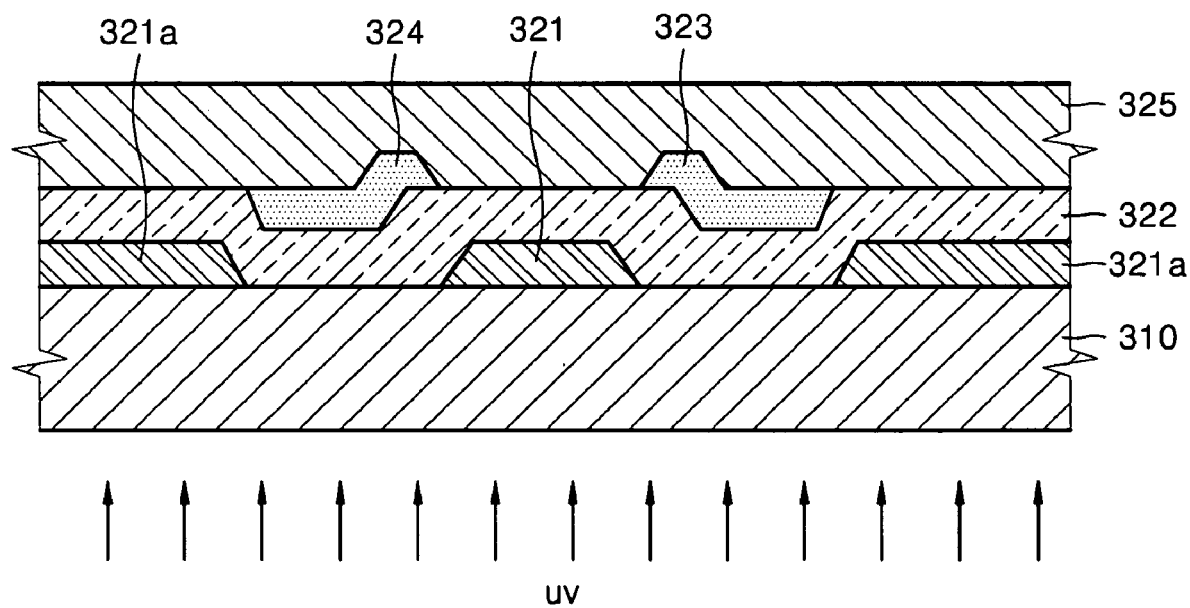
FIGS. 10 through 14 are cross-sectional views illustrating a method of manufacturing an organic TFT according to another embodiment.

FIGS. 10 through 14 are cross-sectional views illustrating a method of manufacturing an organic TFT according to another embodiment. A difference between the method of manufacturing of the current embodiment and the method illustrated in FIGS. 6 through 9 is that, as depicted in FIG. 10, the method of the current embodiment further includes an operation of forming a blocking layer 321a at the same level as a gate electrode 321. That is, in addition to the gate electrode 321, the blocking layer 321a is also formed on a substrate 310.

The blocking layer 321a has openings as depicted in FIG. 10 so that UV rays from below reach a source electrode 323 and a drain electrode 324 which will be formed later thereover. The blocking layer 321a may be formed at the same time as the gate electrode 321, or separately formed when necessary. When the blocking layer 321a and the gate electrode 321 are formed at the same time, they can be formed of the same material. The blocking layer 321a and the gate electrode 321 are formed of an opaque material so that the blocking layer 321a and the gate electrode 321 block light when a back exposing process is performed through the substrate 310 using ultraviolet rays.

When the blocking layer 321a and the gate electrode 321 are formed of the same material, the blocking layer 321a also may have electrical conductivity. Accordingly, the blocking layer 321a can be an element of another organic TFT. When a capacitor is formed around the blocking layer 321a, the blocking layer 321a can serve as an electrode of the capacitor.

Also, the blocking layer 321a can perform various roles besides the blocking role in a back exposing process which will be described later.

A gate insulating film 322 covering the gate electrode 321 and the blocking layer 321a is formed. Then, the source electrode 323 and the drain electrode 324 are formed on the gate insulating film 322 using a transparent material. A positive photoresist layer 325 is coated on the resultant product.

Figure 11:
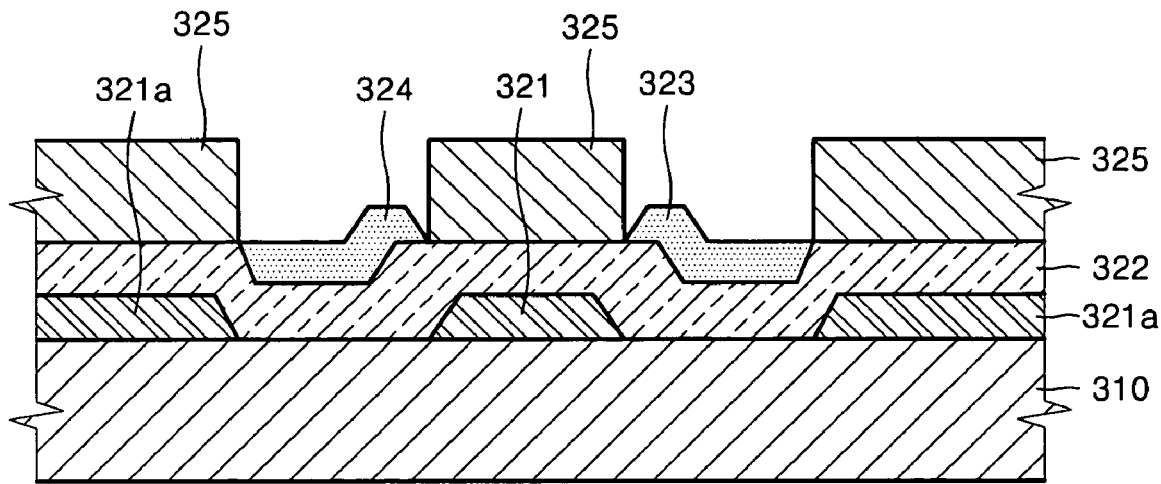

Subsequently, when a back exposing process through the substrate 310 is performed, portions of the positive photoresist layer 325 over the gate electrode 321 and the blocking layer 321a are not exposed. However, portions of the positive photoresist layer 325 on the source electrode 323 and the drain electrode 324 are exposed. When a developing process is performed, as depicted in FIG. 11, the portions of the positive photoresist layer 325 over the source electrode 323 and the drain electrode 324 are removed.

Figure 12:
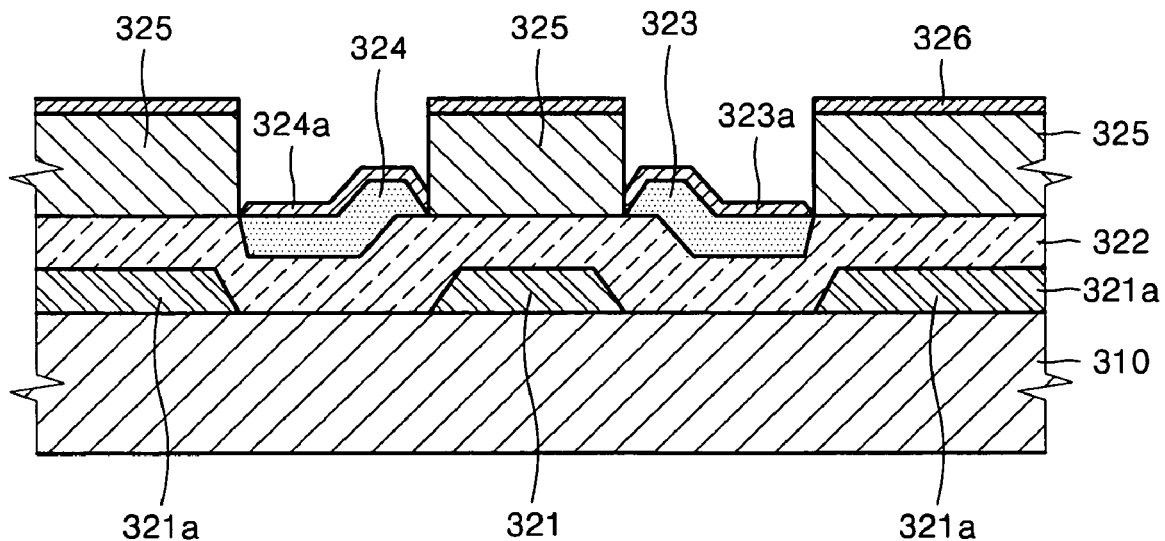
Figure 13:
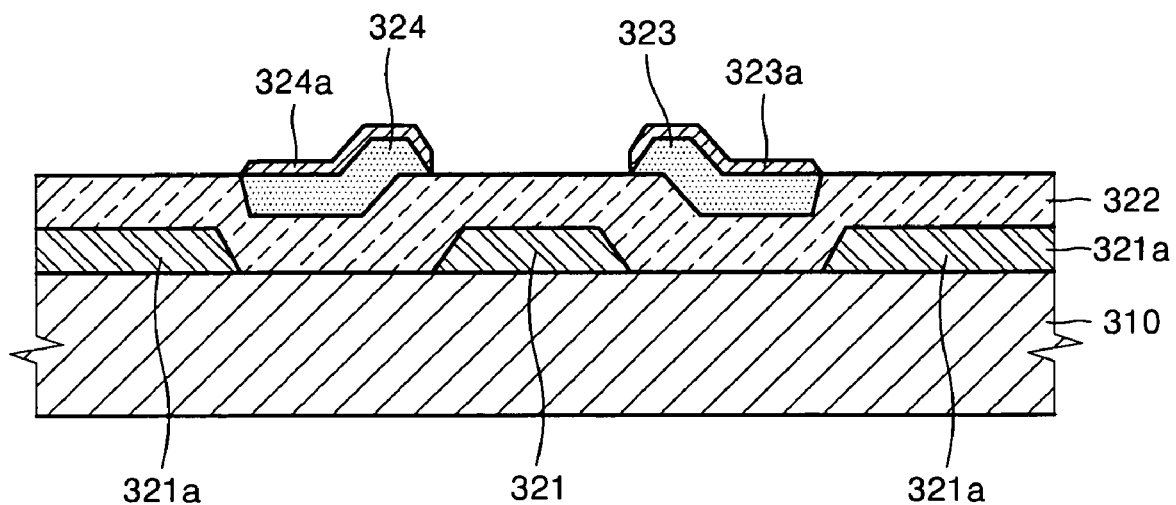
Figure 14:
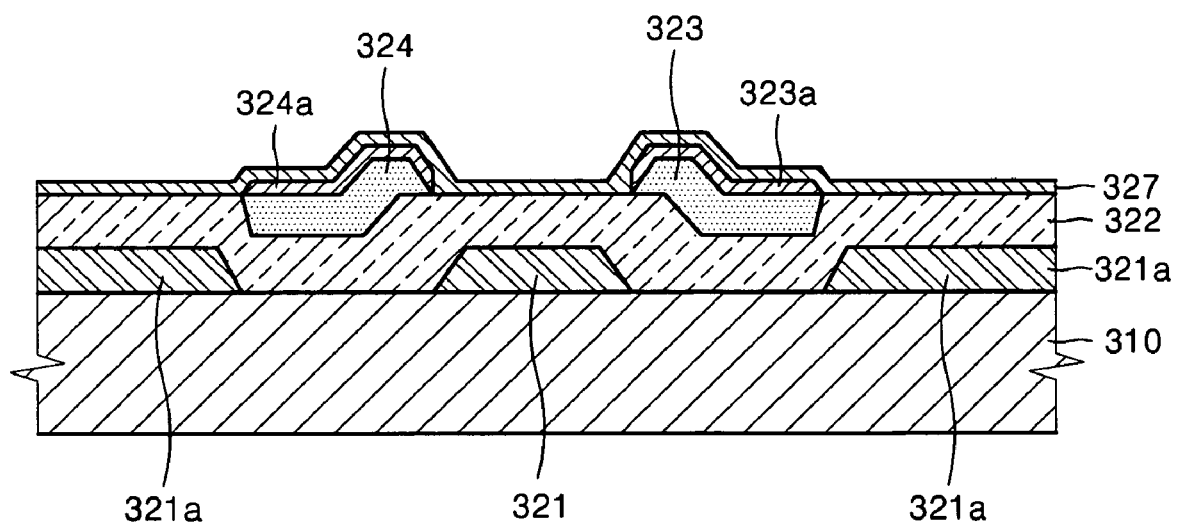

Next, as depicted in FIG. 12, a metal layer 326, which is formed of a noble metal, is formed on the resulting structure. When the remainder of the positive photoresist layer 325 is removed, as depicted in FIG. 13, an auxiliary source electrode 323a and an auxiliary drain electrode 324a are respectively formed on the source electrode 323 and the drain electrode 324. As depicted in FIG. 14, an organic semiconductor layer 327 is formed on the resulting structure. The organic TFT has the auxiliary source electrode 323a and the auxiliary drain electrode 324a that reduce contact resistance between the source and drain electrodes 323 and 324 and the organic semiconductor layer 327.

Figure 15:
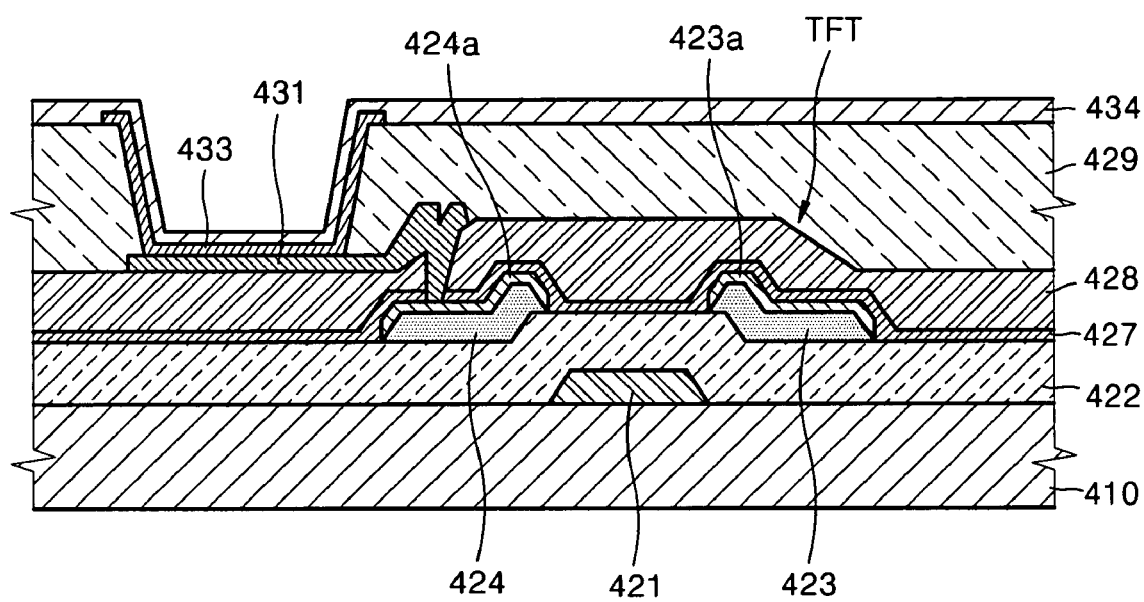
FIG. 15 is a cross-sectional view illustrating a portion of an organic light emitting display device according to another embodiment.

The organic TFTs described above have flexibility. Accordingly, these organic TFTs can be suitable for various flexible flat panel display devices, such as liquid crystal display devices and organic light emitting display devices. An organic light emitting display device having such an organic TFT will now be described with reference to FIG. 15. FIG. 15 is a cross-sectional view illustrating a portion of an organic light emitting display device according to another embodiment.

The illustrated organic light emitting display device may have an organic TFT manufactured according to the embodiments described above. The organic TFT and the light emitting device are located over a substrate 410.

The organic light emitting display device can be one of various types. The illustrated organic light emitting display device is an AM type light emitting display device having an organic TFT.

Referring to FIG. 15, each of the sub-pixels in the organic light emitting display device includes at least one organic TFT. A buffer layer (not shown) formed of $SiO_2$ can be formed over the substrate 410. An organic TFT as described above is formed over the buffer layer. The organic TFT included in FIG. 15 is one of the organic TFTs described in the previous embodiments or modified versions thereof, but the invention is not limited thereto.

A passivation film 428 formed of $SiO_2$ is formed on the organic TFT. A pixel defining film 429 formed of acryl or polyimide is formed on the passivation film 428. The passivation film 428 acts as a protection film for protecting the organic TFT and as a planarizing film for planarizing an upper surface of the organic TFT.

In certain embodiments, at least one capacitor can be connected to the organic TFT. A circuit that includes the organic TFT is not limited to the circuit depicted in FIG. 15, and various modifications are possible.

An organic light emitting element is connected to an auxiliary drain electrode 424a. The organic light emitting element includes a first electrode 431, a second electrode 434 facing the first electrode 431, and an intermediate layer 433 having a light emitting layer interposed between the first and second electrodes 431 and 434. The second electrode 434 can be formed in various ways. For example, the second electrode 434 can be formed as one body over a plurality of pixels.

In FIG. 15, the intermediate layer 433 may be patterned to be only over sub-pixels. In other embodiments, the intermediate layer 433 may also be formed to extend over a plurality of adjoining sub-pixels. The intermediate layer 433 may be formed in various ways. For example, a portion of the intermediate layer 433 can be formed in each sub-pixel, and another portion of the intermediate layer 433 can be formed to extend over a number of adjacent sub-pixels.

The first electrode 431 acts as an anode, and the second electrode 434 acts as a cathode. The polarity of the first and second electrodes 431 and 434 may be reversed. The first electrode 431 may be a transparent electrode or a reflection electrode. When the first electrode layer 431 is a transparent electrode, the first electrode 431 can be formed of ITO, IZO, ZnO or $In_2O_3$. When the first electrode 431 is a reflection electrode, the first electrode 431 may be formed of ITO, IZO, ZnO or $In_2O_3$ on a reflection film after forming the reflection film using Ag, Mg, Al, Pt, Pd, Au, Ni, Nd, Ir, Cr, or a compound of these metals.

The second electrode 434 may also be a transparent electrode or a reflection electrode. When the second electrode 434 is a transparent electrode, a material layer formed of a metal such as Li, Ca, LiF/Ca, LiF/Al, Al, Ag, Mg, or a compound of these metals is deposited to face the intermediate layer 433. Then, an auxiliary electrode layer or a bus electrode line formed of a material for forming the transparent electrode, such as ITO, IZO, ZnO or $In_2O_3$, can be formed on the material layer. When the second electrode layer 434 is a reflection electrode, the second electrode layer 434 is formed by depositing Li, Ca, LiF/Ca, LiF/Al, Al, Ag, Mg, or a compound of these metals.

The intermediate layer 433 interposed between the first and second electrodes 431 and 434 can be formed of a low molecular weight organic material or a polymer. When the intermediate layer 433 is formed of a low molecular weight organic material, the intermediate layer 433 can be formed in a single or a composite structure by stacking a Hole Injection Layer (HIL), a Hole Transport Layer (HTL), an Emission Layer (EML), an Electron Transport Layer (ETL), an Electron Injection Layer (EIL) or a combination of these layers. The intermediate layer may also be formed of copper phthalocyanine (CuPc), N,N'-Di(naphthalene-1-yl)-N,N'-diphenyl-benzidine (NPB), or tris-8-hydroxyquinoline aluminum (Alq3). The intermediate layer 433 can be formed in various forms and can be formed of various materials. The intermediate layer 433 formed of a low molecular weight organic material can be formed using an evaporation method in which a mask is employed.

The intermediate layer 433 may also be formed of a polymer. The intermediate layer 433 can have a structure including a HTL and an EML. The HTL may be formed of poly-(2,4)-ethylene-dihydroxy thiophene (PEDOT). The EML may be formed of Poly-Phenylenevinylene (PPV) or Polyfluorene.

The organic light emitting element formed on the substrate 410 is sealed by a facing member (not shown). The facing member may be formed of glass or a plastic material used to form the substrate 410. The facing member may also be formed of a metal.

In the organic light emitting display device described above, a light emitting display device reliably displays an image according to an image signal, using the organic TFTs of the embodiments.

Also, the embodiments are made with respect to flexible flat panel display devices. However, the organic TFTs described above can be applied to any display device.

In the embodiments described above, an organic TFT having reduced contact resistance between source and drain electrodes and an organic semiconductor layer can be manufactured. Accordingly, a flat panel display device that can display a correct and clear image using the organic TFT can be produced.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. An organic TFT comprising:
   a substrate;
   a gate electrode and a blocking layer formed over the substrate;
   a gate insulating film over the gate electrode and the blocking layer;
   a source electrode and a drain electrode formed over the gate insulating film;
   an auxiliary source electrode and an auxiliary drain electrode formed on the source electrode and the drain electrode, respectively, wherein a distance between the auxiliary source electrode and the auxiliary drain electrode is substantially equal to a length of the gate electrode; and
   an organic layer having a semiconductor characteristic and contacting the auxiliary source electrode and the auxiliary drain electrode.

2. The organic TFT of claim 1, wherein the blocking layer has openings underlying the source electrode and the drain electrode.

3. The organic TFT of claim 1, wherein the blocking layer comprises the same material as that of the gate electrode.

4. The organic TFT of claim 1, wherein the gate electrode and the blocking layer comprise an opaque material.

5. The organic TFT of claim 1, wherein the auxiliary source electrode and the auxiliary drain electrode comprise a noble metal.

6. A flat panel display device comprising the organic TFT of claim 1.

7. The flat panel display device of claim 6, further comprising an organic light emitting element electrically connected to the organic TFT.

* * * * *

UNITED STATES PATENT AND TRADEMARK OFFICE
CERTIFICATE OF CORRECTION

| | | |
|---|---|---|
| PATENT NO. | : 8,076,733 B2 | Page 1 of 1 |
| APPLICATION NO. | : 11/526945 | |
| DATED | : December 13, 2011 | |
| INVENTOR(S) | : Hun-Jung Lee, Sung-Jin Kim and Jong-Han Jeong | |

It is certified that error appears in the above-identified patent and that said Letters Patent is hereby corrected as shown below:

At column 4, line 50, please delete "polythiopenevinylene", and insert -- polythiophenevinylene --, therefor.

At column 4, line 53, please delete "phthalocianin", and insert -- phthalocyanine --, therefor.

At column 4, line 54, please delete "phyromeliticdianhydride", and insert -- pyromelliticdianhydride --, therefor.

At column 4, line 54-55, please delete "phyromelitic diimid", and insert -- pyromellitic diimide --, therefor.

At column 4, line 55, please delete "perrylenetetracarboxy", and insert -- perylenetetracarboxy --, therefor.

At column 4, line 56-57, please delete "perrylenetetracarboxylic diimid", and insert -- perylenetetracarboxylic diimide --, therefor.

Signed and Sealed this
Eighth Day of May, 2012

David J. Kappos
*Director of the United States Patent and Trademark Office*